United States Patent
Yamamoto et al.

(10) Patent No.: US 7,809,039 B2
(45) Date of Patent: Oct. 5, 2010

(54) LIGHT-EMITTING DEVICE AND MANUFACTURING METHOD OF THE SAME

(75) Inventors: Kazushige Yamamoto, Yokohama (JP); Haruhiko Yoshida, Funabashi (JP); Tatsuo Shimizu, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 15 days.

(21) Appl. No.: 12/409,693

(22) Filed: Mar. 24, 2009

(65) Prior Publication Data

US 2009/0245314 A1    Oct. 1, 2009

(30) Foreign Application Priority Data

Mar. 26, 2008   (JP)   ............... 2008-081016

(51) Int. Cl.
*H01S 5/00*   (2006.01)
(52) U.S. Cl. ............... 372/50.1; 372/43.01; 372/50.11; 372/87
(58) Field of Classification Search ............... 372/50.1, 372/43.01, 50.11
See application file for complete search history.

(56) References Cited

U.S. PATENT DOCUMENTS

| | | | |
|---|---|---|---|
| 5,636,234 A * | 6/1997 | Takagi | 372/43.01 |
| 7,446,348 B2 | 11/2008 | Yamamoto et al. | |
| 2003/0063442 A1 * | 4/2003 | Kimoto et al. | 361/704 |
| 2007/0145394 A1 | 6/2007 | Shimizu et al. | |
| 2007/0267711 A1 | 11/2007 | Yamamoto et al. | |
| 2008/0061369 A1 | 3/2008 | Shimizu et al. | |
| 2008/0079022 A1 | 4/2008 | Yamamoto et al. | |
| 2009/0057689 A1 | 3/2009 | Yamamoto et al. | |
| 2009/0065791 A1 * | 3/2009 | Yen et al. | 257/98 |

FOREIGN PATENT DOCUMENTS

JP    2007-294628    11/2007

OTHER PUBLICATIONS

Kevin P. Homewood, et al., "Light from SI via dislocation loops", Materials Today, vol. 8, Jan. 2005, pp. 34-39.

Vilson R. Almeida, et al., "Guiding and confining light in void nanostructure", Optics Letters, vol. 29, No. 11, Jun. 1, 2004, pp. 1209-1211.

(Continued)

*Primary Examiner*—Dung T Nguyen
(74) *Attorney, Agent, or Firm*—Oblon, Spivak, McClelland, Maier & Neustadt, L.L.P.

(57) ABSTRACT

A semiconductor light-emitting device including an insulating film, an optical resonator formed on the insulating film, and a p-electrode and an n-electrode which are disposed on the both sides of the optical resonator, respectively. The optical resonator includes a first semiconductor wire and a second semiconductor wire which are arranged in parallel with a space left therebetween, the space being narrower than emission wavelength, resonator mirrors disposed at the both ends of these semiconductor wires, and a plurality of semiconductor ultra-thin films which are interposed between the first semiconductor wire and the second semiconductor wire and are electrically connected with these semiconductor wires, the first semiconductor wire is electrically connected with the p-electrode, and the second semiconductor wire is electrically connected with the n-electrode, thereby enabling the semiconductor ultra-thin films to generate laser oscillation as a current is injected thereinto.

19 Claims, 5 Drawing Sheets

OTHER PUBLICATIONS

Carlos Angulo Barrios, et al., "Electrically driven silicon resonant light emitting device based on slot-waveguide", Optics Express, vol. 13, No. 25, 2005, pp. 10092-10101.

Shin-ichi, Saito, et al., "Electro-Luminescence from Ultra-Thin Silicon", Japanese Journal of Applied Physics, vol. 45, No. 27, 2006, pp. L679-L682.

Lorenzo Pavesi, "Routes toward silicon-based lasers", Materials Today, vol. 8, Jan. 2005, pp. 18-25.

U.S. Appl. No. 12/617,104, filed Nov. 12, 2009, Yamamoto et al.

* cited by examiner

LIGHT-EMITTING DEVICE AND MANUFACTURING METHOD OF THE SAME

CROSS-REFERENCE TO RELATED APPLICATIONS

This application is based upon and claims the benefit of priority from prior Japanese Patent Application No. 2008-081016, filed Mar. 26, 2008, the entire contents of which are incorporated herein by reference.

BACKGROUND OF THE INVENTION

1. Field of the Invention

This invention relates to a semiconductor light-emitting device having novel element structure including an ultra-thin film active layer.

2. Description of the Related Art

In recent years, there have been successively reported silicon photonics wherein silicon materials which have been considered unsuitable for use in optical applications are used as a base material. The silicon photonics would become a basis for future super-high-speed/low-power-consumption photoelectric hybridized LSIs such as a silicon Raman laser which can be made to oscillate by optical excitation and a silicon light modulator which can be actuated at a high frequency of the order of gigahertz.

Silicon photonics is a field of research for studying how to on-chip/systematize individual photoelectronic devices constituting a basic unit of an optical interconnection composed of "emission-transmission-photodetection" by making use of LSI fabrication techniques based on CMOS interchange. At present, mainly in the United States of America, studies on the optical modulator, switches, waveguide and light-receiving device, all based on silicon, are extensively conducted. Among these schemes, the practical device that no one has succeeded to develop up to date is a current-injection-type light-emitting device which is based on silicon, especially a silicon semiconductor laser.

The semiconductor laser takes a role of a "transmitter" in a basic unit of an optical interconnection and hence is considered as being a key device. If it is possible to develop the silicon semiconductor laser, the manufacturing merit in terms of cost is considered enormous. However, in spite of many studies and researches for past many years, no one has succeeded in developing a practical silicon semiconductor laser.

Followings are the explanation about the problems on the development of silicon semiconductor laser, which will be discussed by referring to the laser oscillation conditions.

The laser oscillation conditions can be represented by a conditional inequality of: Effective gain ($\Gamma \times g$)$\geq$Loss $\alpha$ (where $\Gamma$ is the light confinement coefficient, g is the gain, and $\alpha$ is the loss). It will be intuitively recognized from this conditional inequality that the oscillation of laser is enabled to generate as the effective gain is higher than the loss. Next, silicon will be compared with a compound semiconductor with respect to each of physical parameters such as $\Gamma$, g and $\alpha$, thereby making it clear the problems involved in the employment of silicon.

The loss $\alpha$ is a total of the mirror loss of optical resonator, the absorption loss of semiconductor material, scattering loss and diffraction loss. The loss $\alpha$ of the optical resonator constituted by silicon can be confined, in technical viewpoint, to the same level of value as that of the optical resonator constituted by a compound semiconductor. In view of this fact, there is not any substantial difference between silicon and the compound semiconductor with respect to the loss $\alpha$.

The gain "g" is an important physical parameter governing the oscillation. As the internal quantum efficiency of emission becomes higher, the value of the gain "g" becomes higher and hence is more liable to generate laser oscillation. One of the reasons which makes it possible to realize a semiconductor laser by making use of a compound semiconductor can be attributed to high internal quantum efficiency. On the other hand, silicon is an indirect semiconductor and hence silicon is non-radiative because of photon-supported transition, so that the internal quantum efficiency thereof is almost zero. This means that, before discussing the question of the laser oscillation, it should be noticed that it is difficult to realize a light-emitting device by making use of silicon to begin with.

In an attempt to enable a light-emitting device employing silicon to emit brightly, various techniques have been tried including the employment of quantum dots, ultra-thin film, rare earth element doping, dislocation engineering, semiconductor silicide, etc. However, there is still a problem that the internal quantum efficiency of emission is still too small (for example, S. Saito, et al, Jpn. J. Appl. Phys, 45, L679 [2006]; L. Pavesi, Materials Today, 8, 18 [2005]; and K. P. Homewood, Materials Today, 8, 34 [2005]).

It has been found out as a result of the studies made by the present inventors that the internal quantum efficiency of a Group IV element semiconductor such as not only silicon but also germanium and silicon germanium compound can be remarkably increased by the doping of a specific kind of impurities and by further reducing the thickness of ultra-thin film, thereby making it possible to develop the same level of strong light emission as that the compound semiconductor. Accordingly, it is possible to increase the value of g by employing a strong light emission layer having a thickness of several nanometers (impurity-doped ultra-thin silicon film) as an active layer. In view of this possibility, in the case of g, there is not any substantial difference between silicon and the compound semiconductor as in the case of $\alpha$.

The light confinement coefficient $\Gamma$ is a value that can be defined as a ratio of photon energy which is spatially confined in an active layer. The value of the $\Gamma$ of a silicon light-emitting device is relatively low, thus clearly differentiating silicon in this respect from the compound semiconductor in contrast to the aforementioned $\alpha$ and g.

For example, in the case of a silicon light-emitting device of lateral current-passing structure including an active layer formed of an ultra-thin film interposed between a P- and an N-layer which are formed on an insulating layer (see for example, JP-A 2007-294628), the mode electric field distribution of the light being propagated in this light-emitting device will be concentrated not at the active layer formed of the ultra-thin silicon film but at the P- and N-layers neighboring the active layer. Because of this, the value of $\Gamma$ becomes nearly zero.

Whereas, in the case of a compound semiconductor laser having an ordinary ridge structure, this $\Gamma$ is enabled to have a value of several percent. This value is exceptionally large as compared with that of a silicon light-emitting device. Just like the silicon light-emitting device, in the case of the compound semiconductor laser also, an ultra-thin film such as a single quantum well or a multiple quantum well is certainly employed. However, a fundamental difference between the compound semiconductor laser and the silicon light-emitting device of lateral current-conducting structure resides in the facts that, in the case of the compound semiconductor laser, semiconductor layers (P- and N-layers) slightly differing in composition from the active layer, exhibiting a lower refractive index and a wider gap than the active layer, and having electrical conductivity exist, thereby making it possible to constitute a double hetero structure wherein the active layer is directly sandwiched by these semiconductor layers. Because of this possibility to create this double hetero structure, it is possible to confine the electric field distribution of propagation mode in the ultra-thin active layer, thus realizing an increase in value of the Γ.

In the case of the silicon light-emitting device wherein the active layer is formed of a lateral current-conducting structure consisted of an ultra-thin silicon film, it cannot take this double hetero structure for the following two reasons. One of the reasons is the lack of an appropriate semiconductor material for constituting corresponding P- and N-layers. Different from the P- and N-layers of the compound semiconductor laser, the P- and N-layers of the silicon light-emitting device are enabled to take only the role of injecting a current into the active layer formed of ultra-thin film. The other reason is the fact that even if such an appropriate semiconductor material exists, the lateral current-conducting structure is more suited for creating the active layer of "impurity-doped ultra-thin silicon film" in viewpoint of enhancing the internal quantum efficiency. In the case of the impurity-doped ultra-thin silicon film, the internal quantum efficiency can be enhanced by strengthening the electron-hole pair binding, so that it is required to employ energetically strong confinement. Because of this, excluding a very small junction portion between the active layer and the P- and N-layers for the injection of a current, most of the active layer is required to be in contact with the insulator exhibiting a wide gap.

It will be understood from the above-described explanation that mainly because of the small value of Γ, the effective gain Γg is exceptionally small as compared with that of the compound semiconductor laser. Therefore, even if it is possible to enable the silicon light-emitting device to generate the emission of light by the injection of a current, it is impossible to generate laser oscillation. In other words, even if it is possible to realize a silicon light-emitting diode, it is very difficult to realize a silicon semiconductor laser. In order to realize the silicon semiconductor laser, although it is indispensable to enhance the light confinement coefficient Γ, it is very difficult to achieve the enhancement of Γ by making use of the active layer formed of an ultra-thin silicon film of lateral current-conducting structure which is inherently difficult to realize the confinement of light.

As explained above, in the case of the conventional silicon light-emitting devices, it has been considered impossible to realize the laser oscillation by way of current injection.

BRIEF SUMMARY OF THE INVENTION

An object of the present invention is to provide a semiconductor light-emitting device having a novel element structure which is different from the double hetero structure and large in light confinement coefficient Γ.

According to a first aspect of the present invention, there is provided a semiconductor light-emitting device comprising: an insulating film; an optical resonator formed on the insulating film and including a first semiconductor wire and a second semiconductor wire which are arranged in parallel with a space left therebetween, the space being narrower than emission wavelength, resonator mirrors disposed at both ends of these semiconductor wires, and a plurality of semiconductor ultra-thin films which are interposed between the first semiconductor wire and the second semiconductor wire and are electrically connected with these semiconductor wires; and a p-electrode and an n-electrode which are disposed on both sides of the optical resonator, respectively, wherein the first semiconductor wire is electrically connected with the p-electrode, and the second semiconductor wire is electrically connected with the n-electrode, thereby enabling the semiconductor ultra-thin films to generate laser oscillation as a current is injected thereinto.

According to a second aspect of the present invention, there is provided a semiconductor light-emitting device comprising: an insulating film; a ring-shaped optical resonator formed on the insulating film, and including a first ring-shaped semiconductor wire and a second ring-shaped semiconductor wire which are arranged side by side with a space left therebetween, narrower than emission wavelength, and a plurality of semiconductor ultra-thin films interposed between the first semiconductor wire and the second semiconductor wire and electrically connected with these semiconductor wires; and a p-electrode and an n-electrode which are disposed on the both sides of the optical resonator, respectively, wherein the first semiconductor wire is electrically connected with the p-electrode, and the second semiconductor wire is electrically connected with the n-electrode, thereby enabling the semiconductor ultra-thin films to generate laser oscillation as a current is injected thereinto.

According to a third aspect of the present invention, there is provided a semiconductor light-emitting device comprising: an insulating film; a first semiconductor wire and a second semiconductor wire which are formed on the insulating film and arranged in parallel with a space left therebetween, narrower than emission wavelength; a plurality of semiconductor ultra-thin films are arranged between the first semiconductor wire and the second semiconductor wire and electrically connected with these semiconductor wires; and a p-electrode and an n-electrode which are formed on the insulating film and disposed on the both sides of the first and the second semiconductor wires, respectively, wherein the first semiconductor wire is electrically connected with the p-electrode, and the second semiconductor wire is electrically connected with the n-electrode, thereby enabling the semiconductor ultra-thin films to generate electroluminescence as a current is injected thereinto.

DETAILED DESCRIPTION OF THE INVENTION

Figure 1:
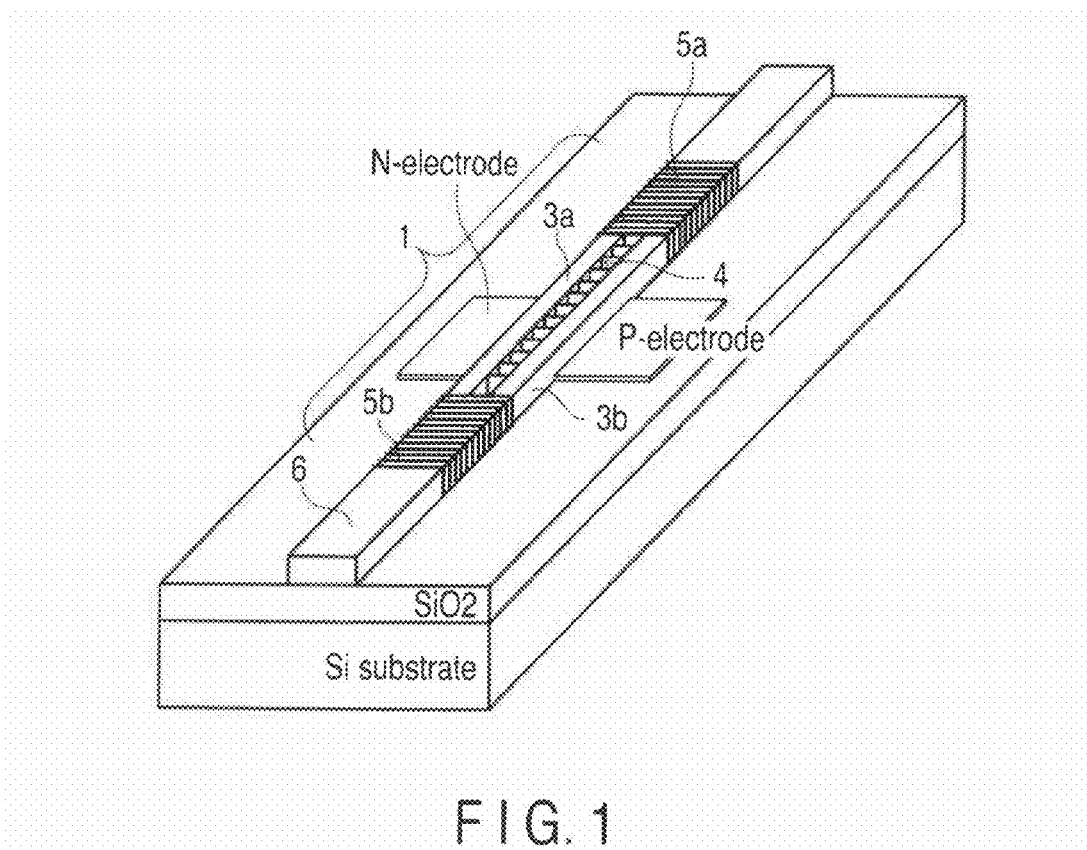
FIG. 1 is a perspective view of a silicon semiconductor laser according to a first embodiment of the present invention.

Next, various embodiments of the present invention will be explained as follows.

The semiconductor light-emitting device according to a first embodiment of the present invention comprises an optical resonator formed on an insulating film, and a p-electrode and an n-electrode which are disposed on the opposite sides of the optical resonator, respectively. The optical resonator includes a first semiconductor wire and a second semiconductor wire which are arranged in parallel with a space left therebetween, narrower than emission wavelength, resonator mirrors disposed at the opposite ends of these semiconductor wires, and a plurality of semiconductor ultra-thin films interposed between the first semiconductor wire and the second semiconductor wire and electrically connected with these semiconductor wires. In this case, the first semiconductor wire is electrically connected with the p-electrode, and the second semiconductor wire is electrically connected with the n-electrode, thereby enabling the semiconductor ultra-thin films to generate laser oscillation as a current is injected thereinto.

In this semiconductor light-emitting devices each of the resonator mirrors may be a mirror of dielectric multilayer structure including a Group IVb elemental semiconductor or a Group IVb compound semiconductor having a first refractive index, and an insulator having a second refractive index lower than the first refractive index.

The resonator mirror of the optical resonator is optically connected with the waveguide, thereby enabling a laser oscillation beam to be derived from the waveguide.

The resonator mirrors may be spaced apart from each other by a distance ranging from 10 nm to 10 μm, and the first semiconductor wire and the second semiconductor wire may be spaced apart from each other by a distance ranging from 10 to 200 nm.

The semiconductor light-emitting device according to a second embodiment of the present invention comprises a ring-shaped optical resonator formed on an insulating film, and a p-electrode and an n-electrode which are disposed on the opposite sides of the optical resonator, respectively. The optical resonator has a first ring-shaped semiconductor wire and a second ring-shaped semiconductor wire which are arranged side by side with a space narrower than emission wavelength being interposed therebetween, and a plurality of semiconductor ultra-thin films interposed between the first semiconductor wire and the second semiconductor wire and electrically connected with these semiconductor wires. In this case, the first semiconductor wire is electrically connected with the p-electrode, and the second semiconductor wire is electrically connected with the n-electrode, thereby enabling the semiconductor ultra-thin films to generate laser oscillation as a current is injected thereinto.

In this semiconductor light-emitting devices the optical resonator may be optically connected with the waveguide located close to the optical resonator, thereby enabling a laser oscillation beam to be derived from the waveguide.

The semiconductor light-emitting device according to a third embodiment of the present invention comprises a first semiconductor wire and a second semiconductor wire which are arranged in parallel with a space left therebetween, narrower than emission wavelength, and a p-electrode and an n-electrode which are disposed on the opposite sides of the first and the second semiconductor wires, respectively. In this case, a plurality of semiconductor ultra-thin films are interposed between the first semiconductor wire and the second semiconductor wire and electrically connected with these semiconductor wires, the first semiconductor wire is electrically connected with the p-electrode, and the second semiconductor wire is electrically connected with the n-electrode, thereby enabling the semiconductor ultra-thin films to generate electroluminescence as a current is injected thereinto.

In the semiconductor light-emitting devices according to the first, the second and the third embodiment of the present invention, the semiconductor ultra-thin films may be respectively formed of a Group IVb elemental semiconductor or a IVb-IVb compound semiconductor, both having a tetrahedral bond structure and containing an impurity which is capable of creating an emission center and giving a strong light-emitting property, i.e., N and F, or N and Cl, or N and In, or S, or C, or a rare earth ion excluding La and Lu.

Alternatively, the semiconductor ultra-thin films may be respectively formed of a Group IVb elemental semiconductor or a IVb-IVb compound semiconductor both containing no impurity and having a tetrahedral bond structure.

Further, the thickness of each of the semiconductor ultra-thin films may be confined to not more than 10 nm. The intervals of the semiconductor ultra-thin films may be made narrower than the emission wavelength. The semiconductor ultra-thin films may be arranged longitudinally or laterally to the plane of the insulating film.

Next, the construction of this novel laser device exhibiting a large light confinement coefficient $\Gamma$ will be explained. In this laser device, an impurity-doped silicon ultra-thin film, which is capable of exhibiting strong light-emitting properties and constitutes characteristics of the semiconductor light-emitting device according to one embodiment of the present invention, is employed as an active layer. Further, the reason why this laser structure is enabled to exhibit a large value in $\Gamma$ will be explained.

It should be noted that the light-emitting diode is fundamentally the same in structure as a semiconductor laser except that the resonator mirrors are not disposed. Further, as for the semiconductor material to be used for creating the semiconductor ultra-thin films of the active layer or for creating the semiconductor wires, it is possible to employ a Group IV semiconductor or a Group IV compound semiconductor which can be characterized by $sp^3$ hybridized orbital such as diamond structure, zinc blend structure or wurtzite structure. More specifically, it is possible to employ silicon, silicon germanium, germanium, silicon carbide, carbon silicon germanium, etc. In the following explanation, the employment of silicon is exemplified.

It should be noted that, as for the impurity which is capable of giving strong light-emitting properties to the active layer formed of ultra-thin films, it is possible to use, in addition to an N—F pair, an N—In pair, S, C, or rare earth ions excluding La and Lu. Any kinds of impurities other than those mentioned above may be employed, provided that they are capable of giving strong light-emitting properties.

Figure 2:
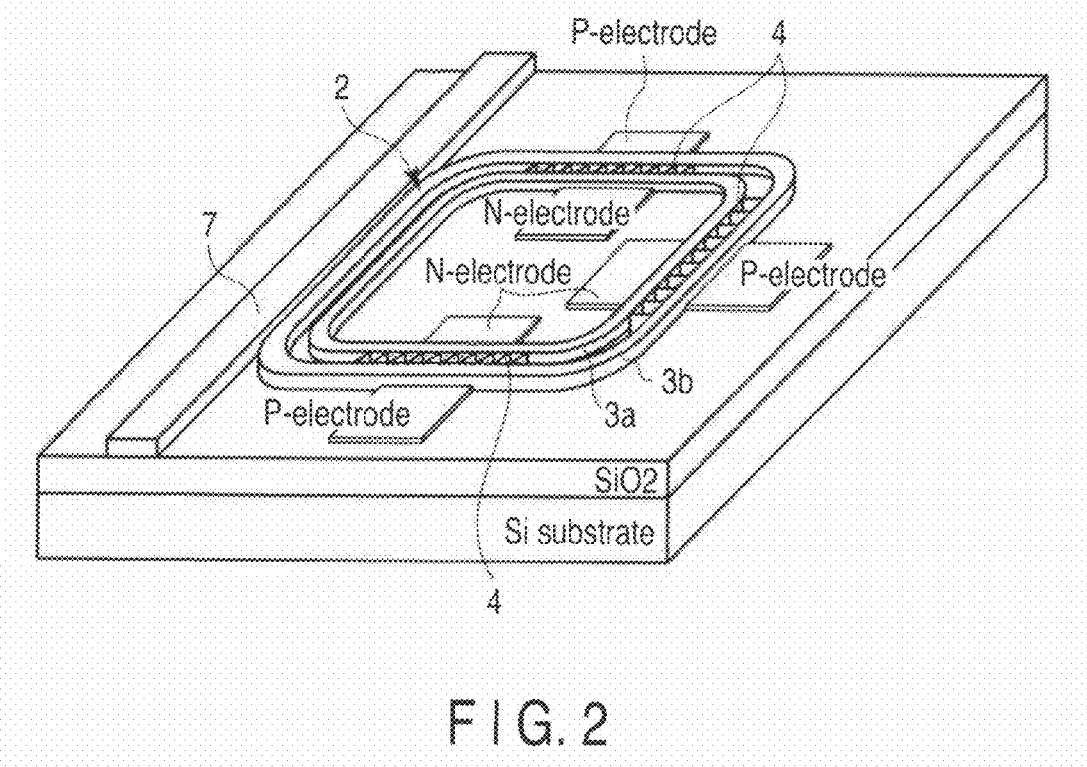
FIG. 2 is a perspective view of a silicon semiconductor laser according to a second embodiment of the present invention.

(1) Simulation of a silicon semiconductor laser exhibiting a high $\Gamma$:

The silicon semiconductor laser according to the first embodiment is provided with a Fabry-Perot-type optical resonator 1 as shown in FIG. 1. The silicon semiconductor laser according to the second embodiment is provided with a ring-shaped optical resonator 2 as shown in FIG. 2. In both of these silicon semiconductor lasers, the optical resonator is disposed on an insulator and is equipped with a pair of silicon wires 3a and 3b which are closely arranged with a space left therebetween, narrower than emission wavelength. Impurity-doped silicon ultra-thin films forming an active layer 4 are longitudinally arranged between these silicon wires 3a and 3b and are electrically connected with these silicon wires 3a and 3b.

It should be noted that in the case of the Fabry-Perot-type optical resonator 1, dielectric multilayer mirrors 5a and 5b are disposed on the opposite ends of these silicon wires 3a and 3b, thereby enabling a laser oscillation beam to be derived from a waveguide 6. In the case of the ring-shaped optical resonator 2, these dielectric multilayer mirrors 5a and 5b are provided and a laser oscillation beam is designed to be derived from a waveguide 7 which is disposed close to the ring-shaped optical resonator 2.

Although the spaces between the impurity-doped silicon ultra-thin films are filled with $SiO_2$, this $SiO_2$ is omitted in the drawing. It should be noted that these spaces may be left vacant without filling them with $SiO_2$. One of the silicon wires, i.e., the silicon wire 3a is electrically connected with a P-electrode and the other silicon wire 3b is electrically connected with an N-electrode.

These optical resonators 1 and 2 may be assumed as being a system which is constructed such that a single silicon waveguide is divided into a pair of silicon wires 3a and 3b with a trench having a width narrower than the emission wavelength being interposed therebetween and the trench being filled with an active layer material. The effects that can be expected from this structure reside in that, because of suitable spatial superposition between the optical field distribution of the oscillator mode and the active layer, it is possible to obtain a high $\Gamma$ value.

The silicon semiconductor laser shown in FIGS. 1 and 2 can be actuated as follows. Namely, as a current is injected into the silicon semiconductor laser, electrons and holes are respectively supplied, via the N- and P-layers, to the impurity-doped silicon ultra-thin films and an electron-hole pair is enabled to generate recombination radiation at the impurity center. Further, this recombination radiation is amplified at the optical resonator and when it exceeds the threshold current to be defined by $\Gamma g \geqq \alpha$, laser oscillation is caused to generate.

Figure 3A:
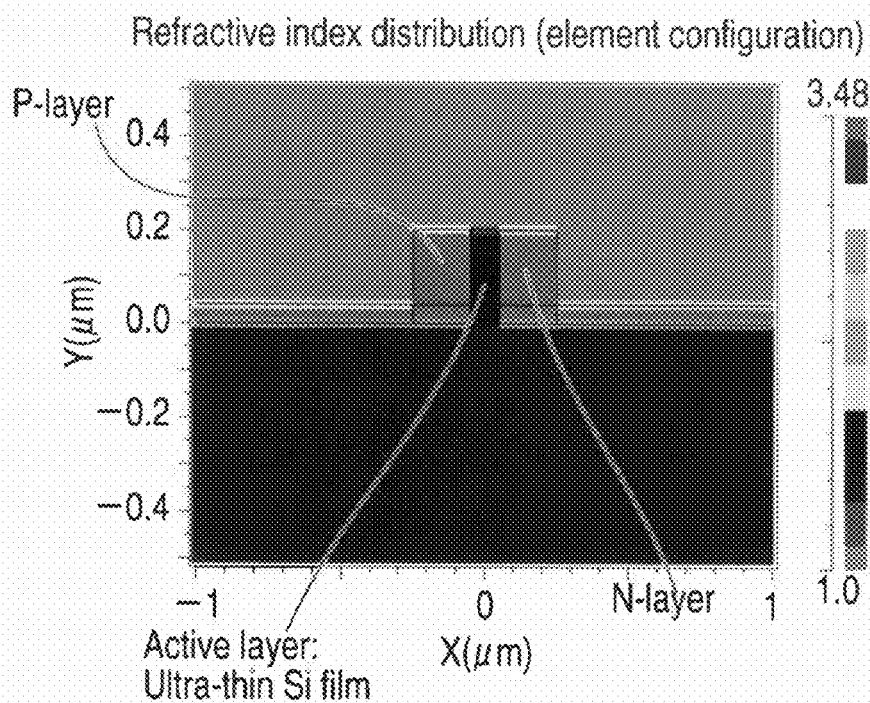
FIGS. 3A and 3B show respectively the results of simulation of optical field mode distribution of the silicon semiconductor laser according to a first embodiment of the present invention.
Figure 3B:
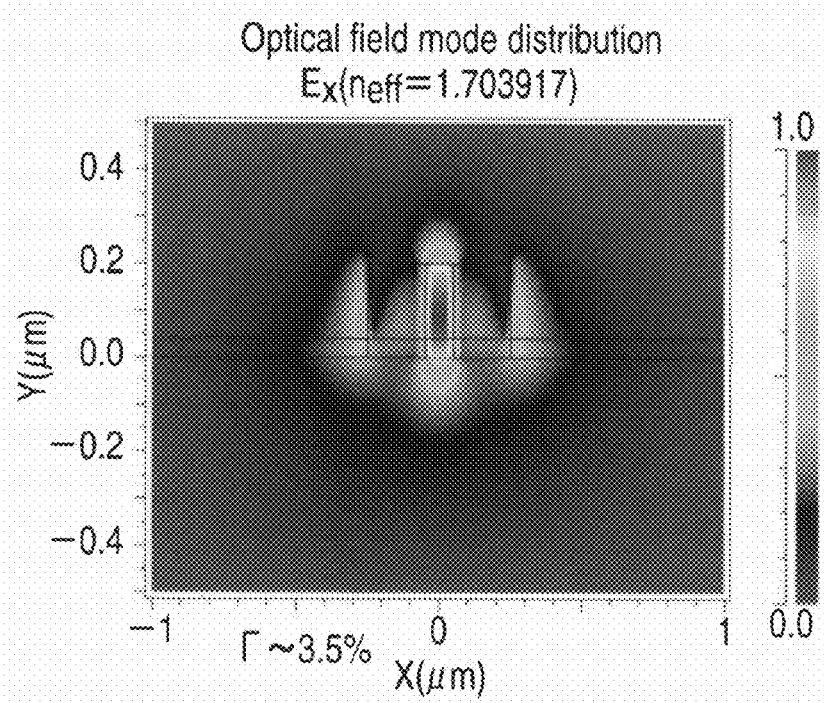
Figure 4A:
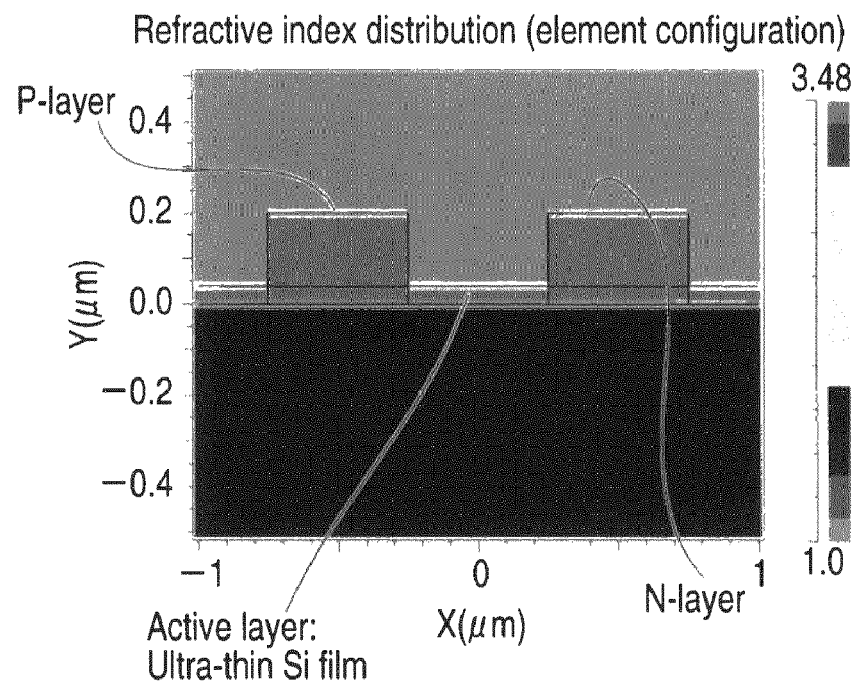
FIGS. 4A and 4B show respectively the results of simulation of optical field mode distribution of the conventional silicon light-emitting diode.
Figure 4B:
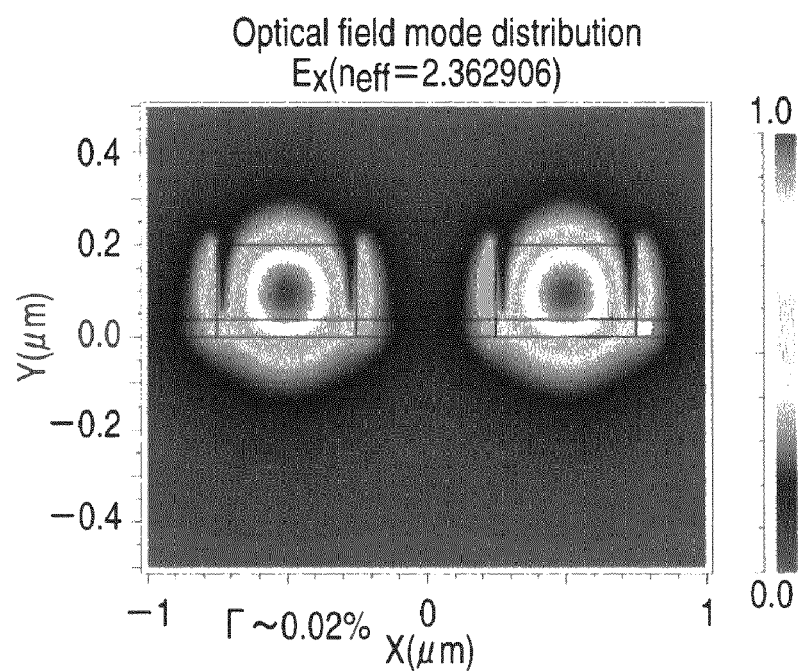

In order to enable the laser oscillation to generate, the value of $\Gamma$ is required to be increased up to the same magnitude of percent order as that of the compound semiconductor laser. FIGS. 3A and 3B show respectively the results of simulation of optical field mode distribution that have been determined from the refractive index distribution of the silicon semiconductor laser shown in FIG. 1. FIGS. 4A and 4B show respectively the results of simulation of optical field mode distribution of the conventional silicon light-emitting diode (for example, the construction described in JP-A 2007-294628).

These results of simulation were derived from the calculation which was performed under the conditions wherein the wavelength of light was set to 1200 nm, the refractive index of the impurity-doped silicon forming the ultra-thin films was 3.5 which was the same as that of bulk crystalline silicon, the film thickness, width and height of the ultra-thin film were 2 nm, 100 nm and 200 nm, respectively, the pitch between neighboring ultra-thin films was set to 20 nm, the space between neighboring ultra-thin films was filled with $SiO_2$ (refractive index: about 1.5), and the width and height of the silicon wires 3a and 3b sandwiching the active layer were both 200 nm.

As seen from the results of calculation shown in FIGS. 4A and 4B, in the case of the conventional structure, the optical field mode distribution was concentrated at the P- and N-layers, thus failing to spatially superimpose with the silicon ultra-thin films forming the active layer. Whereas, in the case of the silicon semiconductor laser having the construction as shown in FIG. 1, the optical field mode was distributed so as to superimpose with the active layer as shown in FIGS. 3A and 3B. The value of $\Gamma$ derived from the calculation based on these optical field distributions was 0.02% in the case of the conventional structure and 3.5% in the case of the structure shown in FIG. 1.

By adapting the structure shown in FIG. 1, it was made possible to increase the value of $\Gamma$ to 100 times or more as compared with that of the conventional structure, thereby making it possible to enhance the confinement of light up to the same level as that of the compound semiconductor laser.

(2) The reasons for realizing high $\Gamma$ value (slot-type waveguide effects):

In the case of the structure according to this embodiment shown in FIG. 1, the optical field is concentrically distributed at the active layer. This may be considered as being a physical phenomenon generally called "slot-type waveguide effects" (V. R. Almeida, Q. Xu, C. A. Barrios, and M. Lipson, Opt. Lett, 29, 1209 [2004]).

By the term "slot-type waveguide", it is intended to mean a second waveguide which is formed of a material of low-refractive index (or vacuum or a gas atmosphere including air atmosphere) and disposed in a waveguide formed of a material of high-refractive index. This slot-type waveguide has a width of nanometer scale which is far narrower than the wavelength of propagating beam. By the term "the slot-type waveguide effects", it is intended to mean a phenomenon wherein the light of TE mode (in the case of the structure shown in FIG. 5, the light to be derived from the optical field which is perpendicular to the low-refractive index region/high-refractive index region interface) is enabled to selectively propagate while being strongly confined within the slot waveguide of low refractive index.

Figure 5:
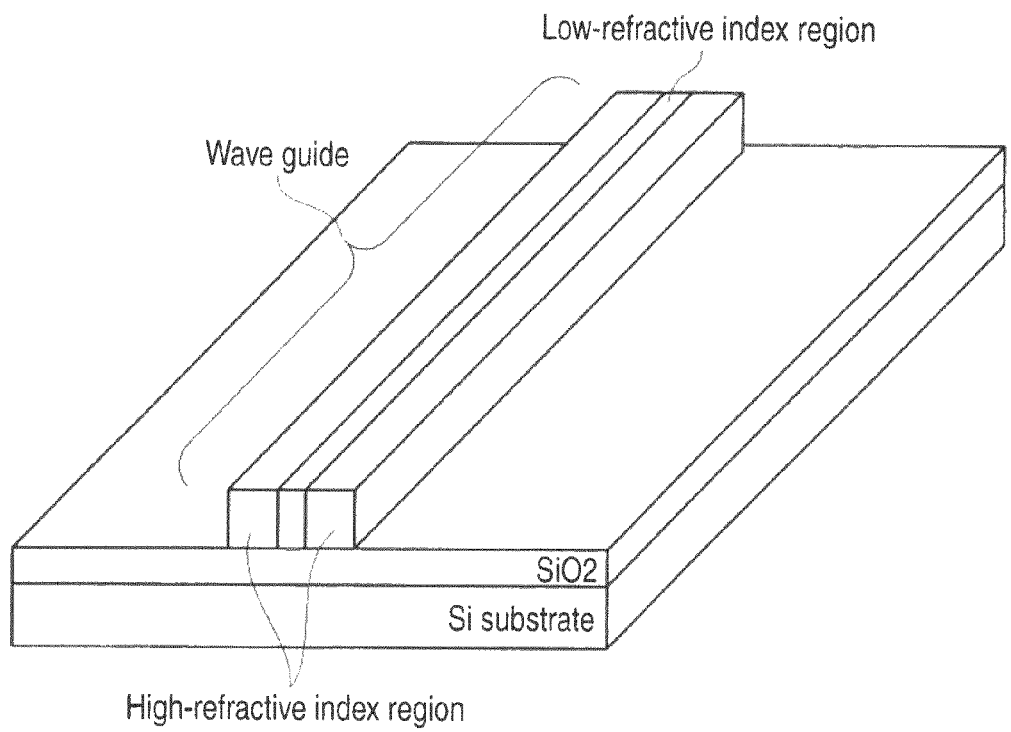
FIG. 5 is a perspective view of a slot waveguide.

The essence of this phenomenon resides in that, in order to satisfy the Maxwell's equation, not the optical field but the electric flux is retained in the normal direction of the low-refractive index region/high-refractive index region interface shown in FIG. 5. When the refractive index of the low-refractive index region is represented by "ns", the refractive index of the high-refractive index region is represented by "nh", the dielectric constant of the low-refractive index region is represented by "$\in s(\cong ns^2)$", the dielectric constant of the high-refractive index region is represented by "$\in h(\cong nh^2)$", the low-refractive index side optical field at the interface is represented by "Es" and the high-refractive index side optical field at the interface is represented by "Eh", the electric flux "D" can be represented by $D = \in s \times Es = \in h \times Eh$. Accordingly, $Es = Eh \times (\in h / \in s) \cong Eh \times (nh/ns)^2$, thereby enabling the optical field of low-refractive index side of the interface to increase by $(nh/ns)^2$ times relative to that of high-refractive index side.

This increase of the optical field is a phenomenon to be generated only at the interface of different refractive index regions, so that the optical field of low-refractive index side is caused to attenuate sharply as it is located away from the interface. In short, the optical field of low-refractive index side is one kind of evanescent field of refractive index interface. However, since the low-refractive index region is very narrow in the case of the slot-type waveguide, the optical-field enhancement effects of a pair of interfaces of refractive index regions are caused to combine with each other, thereby making it possible to create a waveguide mode which is strongly confined within the low-refractive index region.

(3) Physical analysis of the increase of optical field (analytical estimation of $\Gamma$):

In this embodiment, the slot-type waveguide includes semiconductor ultra-thin films exhibiting strong light-emitting properties, and an insulating low-refractive-index material such as $SiO_2$ (refractive index: 1.5 or less) filling the space between the semiconductor ultra-thin films or a hollow structure. The high-refractive-index regions sandwiching the slot-type waveguide is formed of semiconductor wires. In the case of the element structure based on the calculation of FIG. 4, the key points that make it possible to obtain a high value of Γ in this system are as follows.

(3-1) Since the thickness of $SiO_2$ is 18 nm relative to 2 nm in thickness of the impurity-doped silicon ultra-thin film, the refractive index of the active layer region is as low as 1.7.

(3-2) Since the thickness and pitches of the impurity-doped silicon ultra-thin films are as sufficiently small as 2 nm and 20 nm, respectively, relative to 1200 nm of the emission wavelength, thereby making it impossible to expect any resolving power with the light of this wavelength, the active layer region can be deemed as being a uniform low-refractive-index medium having an equivalent refractive index of 1.7.

Herein, this Γ can be analytically estimated. The strength of optical field in the active layer region can be increased by $(3.5/1.7)^2 \cong 4$ times as compared with the high-refractive-index silicon wire regions disposed on the opposite sides. When this strength is reduced to photon energy, the energy of the active layer region is $4^2=16$ times as high as that of the high-refractive-index region. Since the Γ can be defined as being a proportion of photon energy that has been confined within the active layer, the value of Γ can be approximated by an equation of $(Es^2 \times slot$-type waveguide width$)/[(Es^2 \times lot$-type waveguide width$)+(Es^2 \times silicon$ wire width$\times$number of silicon wires$)] \times$(volumetric rate of active layer of ultra-thin films occupying the slot-type waveguide)$\times$(average optical field/maximum optical field). As a result, the value of Γ can be determined by: $Γ \cong 16E^2 \times 100$ nm$/(16E^2 \times 100$ nm$+E^2 \times 200$ nm$\times 2) \times 10\% \times (1/\sqrt{2})=5.7\%$.

This value is about 1.6 times as high as the results of simulation, indicating excellent degree of agreement though it may be rough analysis. The important aspect to be derived from these results is that although the numerical results of Γ was obtained mainly from the simulations, the results of physical analysis also indicated a high value of Γ in the structure according to this embodiment.

According to the above equation, it will be said that under the conditions where the width is made constant, there exists a volumetric rate of the active layer of ultra-thin films where the value of Γ becomes the maximum. Namely, when the volumetric rate of the active layer is 60%, the value of Γ is estimated to increase up to a maximum value of 18%. In the physical analysis, even though the value of Γ tends to be over-estimated, it is certainly possible to expect a value of 10% or so. It should be noted that, as clearly seen from above-described explanations, if the film thickness and pitches of the impurity-doped silicon ultra-thin films are increased to such an extent that cannot be disregarded relative to the emission wavelength, the effects of the slot-type waveguide will be weakened and the value of Γ will be greatly decreased.

In the above description, the results to be derived from the light of TE mode are discussed. In the case of the light of TM mode (in the case of the structure shown in FIG. 5, the light to be derived from the optical field which is parallel with the low-refractive index region/high-refractive index region interface), if it is assumed that the low-refractive-index region is a low-permeability region and the high-refractive-index region is a high-permeability region, the refractive index, the electric field and the electric flux described above may be replaced by a magnetic permeability, a magnetic field and a magnetic flux, respectively. Then, the same discussion described above in relation with the aforementioned TE mode may be applied thereto, thus making it possible to indicate that the light of TM mode is enabled to propagate while being strongly confined within the slot-type waveguide. However, the magnetic permeability of a material to be used in the waveguide such as $SiO_2$ and silicon may be deemed to be approximately 1 irrespective of the kinds of ordinary materials. Accordingly, there is little possibility of generating a phenomenon where the light of TM mode is confined within the slot-type waveguide. The effects of the slot-type waveguide may become dependent on polarized wave.

Finally, in connection with the laser device which is similar in construction to the structure shown in FIG. 1, Barrios et al. (Carnell University, U.S.) have proposed a semiconductor laser wherein the slot-type waveguide region thereof is filled not with impurity-doped silicon ultra-thin films acting as a semiconductor but with an insulating Er-doped $SiO_2$ single body as an active layer material, thereby enabling laser oscillation to be generated from Er as a current is injected thereinto (C. A. Barrios and M. Lipson, Opt. Express, 13, 10092 [2005]).

However, the system proposed by Barrios et al. is accompanied with a problem. The problem is that it is difficult to inject a current into the Er-doped $SiO_2$. Since the construction of this system is similar to the structure shown in FIG. 1, it is certainly possible to obtain a high value of Γ. However, in the system of Barrios et al., the emission to be derived from the current injection is fundamentally weak and the gain "g" is assumed as being small. As a result, in the system of Barrios et al., the product of Γg is assumed as being small and hence it would be difficult to satisfactorily generate laser oscillation. In this respect, the semiconductor laser device according to the present invention wherein the product of Γg is increased through the enhancement of both "Γ" and "g" can be fundamentally distinguished from the system of Barrios et al. Evidently, it is not yet realized, in spite of the proposal made by Barrios et al., to generate the laser oscillation through the injection of a current by making use of the system of Barrios et al.

Next, the semiconductor laser device according to one embodiment of the present invention will be explained with reference to drawings.

One of the points on the occasion of manufacturing a semiconductor laser device by making use of impurity-doped silicon ultra-thin films is the forming of the active layer. The construction of this active layer will be briefly explained prior to the explanation on the semiconductor laser device according to one embodiment of the present invention.

The schematic view of the semiconductor laser device according to one embodiment of the present invention is illustrated in FIG. 1. It should be noted that the device shown in FIG. 1 is taken as one example for explaining the manufacturing process of the semiconductor laser device to be explained hereinafter. As a matter of course, it is possible to adapt other kinds of device structure such as the ring-shaped semiconductor laser equipped with a ring-shaped resonator shown in FIG. 2.

In the case of the lateral-conduction-type semiconductor laser shown in FIG. 1, a p-region, the region of impurity-doped silicon ultra-thin films, and an n-region are arranged as in the same plane. Although not shown in the drawings, the p-region is connected with a p-electrode and the n-region is connected with an n-electrode. Holes are injected from the p-region and electrons are injected from the n-region, thereby enabling the electrons and the holes to recombine and to generate emission in the region of impurity-doped silicon ultra-thin films.

Figure 6A:
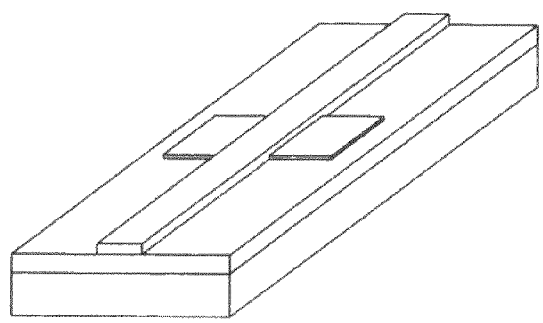
FIGS. 6A through 6E show respectively a perspective view for illustrating, stepwise, the process of forming a silicon semiconductor laser according to a first embodiment of the present invention.
Figure 6B:
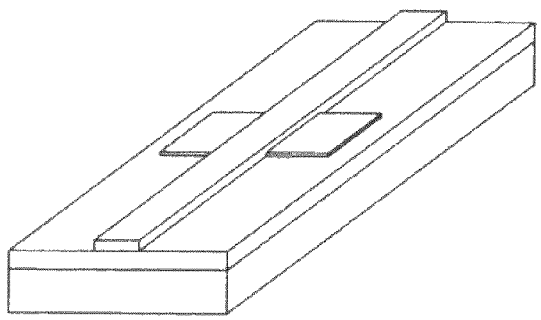
Figure 6C:
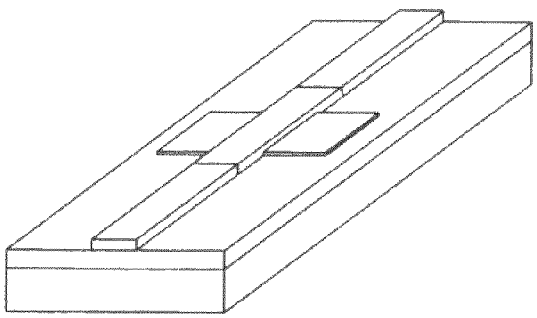
Figure 6D:
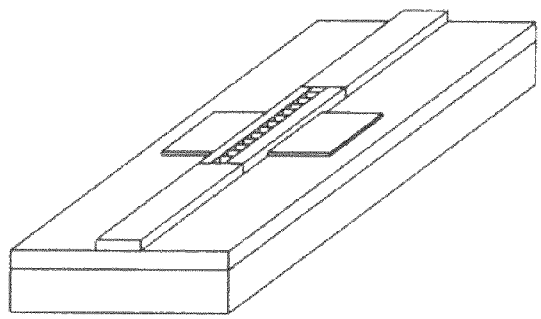
Figure 6E:
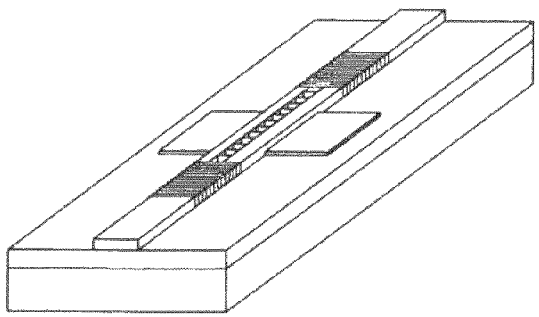

FIGS. 6A through 6E show, respectively, a perspective view for illustrating the device-forming process in order of the steps, wherein the employment of NF-doped silicon ultra-thin films is exemplified. A sequence of manufacturing flow includes a step for working the top silicon layer of an SOI substrate into a waveguide configuration by means of etching (FIG. 6A); a step of forming an N-type layer and a p-type layer by ion-implanting As and B, respectively, into the layer contacting with the waveguide and by annealing the layer (FIG. 6B); a step of subsequently ion-implanting N and F at this time and annealing and activating the ion-implanted portions to form an emission center (FIG. 6C); a step of forming impurity-doped silicon ultra-thin films acting as an active layer by means of the shallow trench isolation (STI) process and subsequently performing surface oxidation by removing process-damaged layer existing on the surface of the NF-doped silicon ultra-thin films to improve the internal quantum efficiency of emission (FIG. 6D); and a step of filling a hollow region existing between neighboring impurity-doped silicon ultra-thin films with $SiO_2$ (FIG. 6E).

As shown in FIG. 1, the resonator mirrors are respectively formed of a silicon/$SiO_2$ dielectric multilayer mirror 5 which is obtained through the working of the silicon waveguide. It should be noted that the manufacturing step of the electrodes is based on the ordinary process which has been adopted in the manufacture of LSI. Therefore, details of this manufacturing step will be omitted together with the omission of the manufacturing step of the dielectric multilayer mirror.

The step of the ion implantation of N and F is performed while optimizing the energy, dosage, bearing of substrate surface, tilt angle, temperature of substrate, etc. The aforementioned implantation parameters are selected in such a manner that impurities are implanted in the top silicon layer of the SOI substrate.

In the step of annealing, the crystal lattice that has been disturbed by the ion injection is restored and, at the same time, the formation of the NF emission center is performed. By the adjustment and optimization of the annealing temperature, time and atmosphere, residual defects can be minimized, thereby enhancing the quality in crystal of the top silicon layer. By doing so, it becomes possible to obtain high-quality NF-doped silicon ultra-thin films.

In the manufacturing step of the NF-doped silicon ultra-thin films, the top silicon layer of the SOI substrate having the NF emission center formed already by way of the STI process is subjected to anisotropic etching to form ultra-thin films. The film thickness of the ultra-thin films can be controlled by suitably selecting the species of gas, gas pressure, etching temperature and etching time.

As explained above, the active layer including impurity-doped silicon ultra-thin films can be created through the combination of ion implantation, annealing and STI process. It should be noted that it is also possible to employ impurity-doped silicon ultra-thin films which can be created by other methods other than the aforementioned method or to employ impurity-doped silicon ultra-thin films which contain, other than N and F, other kinds of impurity atoms which are capable of providing strong emission properties. Namely, as long as it is possible to provide strong emission properties, any kind of impurity, other than the aforementioned impurities, can be used.

Although the foregoing explanation is made based on the impurity-doped silicon ultra-thin films, it is also possible to achieve the laser oscillation by making use of a non-doped silicon ultra-thin films even though the "g" thereof may be small and the threshold value thereof may be high. In the foregoing embodiment, although the ultra-thin films are longitudinally disposed on the SOI substrate, these films may be laterally disposed on the SOI substrate.

Next, the present invention will be more specifically explained by making use of various examples.

Example 1

Semiconductor Laser

In this example, the semiconductor laser shown in FIG. 1 is more specifically described. Namely, the silicon semiconductor laser according to this example has a lateral conduction structure wherein the base semiconductor is formed of silicon. The length of the optical resonator is 300 μm which is the distance between the dielectric multilayer mirrors 5a and 5b. If the mirror reflectance is increased, the laser oscillation can be derived with a shorter optical resonator length.

In the region of the impurity-doped silicon ultra-thin films acting as an active layer, N and F impurities are doped. The concentration of each of N and F is both confined to $1\times10^{18}/cm^3$. The film thickness of each of the N,F-doped silicon ultra-thin films acting as an active layer is set to 2 nm. With respect to the other sizes, they are the same as those of the structure shown in FIG. 3.

The N and F impurities employed in the device of this example are enabled to create 2 levels which are connected by optically allowed transition within the band gap of silicon as described also in Jp-A 2007-294628. In the crystalline silicon, the excitation level originating from the NF emission center is enabled to energetically approach to the silicon conduction band, thereby permitting electron to run away from the NF emission center to the silicon and enabling the electron-hole pair to dissociate, resulting in the quenching at room temperature. In this system, since the transition itself is optically allowed, the bonding of the electron-hole pair is strengthened by increasing thickness of the silicon ultra-thin films, and the dissociation thereof is inhibited, thereby making it possible to achieve the emission at room temperature.

When the semiconductor laser constructed as described above is actuated by making use of a current, holes are injected from the p-region and electrons are injected from the n-region. Then, the electrons and the holes are re-combined at the active layer constituted by the NF-doped silicon ultra-thin films, thereby making it possible to generate the emission through the current injection. This emission is amplified at the optical resonator and when it exceeds the threshold current, laser oscillation is caused to generate.

In the case of the semiconductor laser according to this example, it was possible to obtain, through the injection of a current, a current injection emission of light having a peak at 1.2 μm or so (up to 1 eV) and also to obtain a laser oscillation having a sharp peak at 0.98 eV as a current exceeding 30 mA was injected thereinto. The performance characteristics of this laser at room temperature (25° C.) were: 20 mW in output, and 18.55% in external quantum efficiency (110 mA during 4.4-V operation). By creating an elemental structure for enhancing the Γ by following the principle of the present invention, it is possible, by making use of silicon, to obtain a semiconductor laser having practical characteristics.

Example 2

Ring-Type Semiconductor Laser

This example illustrates a specific example of the ring-type semiconductor laser shown in FIG. 2. The laser according to this example differs from the semiconductor laser of Example 1 in three aspects, i.e., the optical resonator 2 is ring-shaped; accordingly, there is provided no optical resonator mirror; and a distribution-bound-type waveguide 7 is installed in the vicinity of the optical resonator for the purpose of take out a laser beam from the optical resonator. Other features of the laser excluding above-mentioned three points are the same as those of the semiconductor laser of Example 1. It should be noted that the size of the ring was 100 μm×100 μm and the radius of the corner portion thereof was 10 μm.

When the semiconductor laser constructed as described above is actuated by making use of a current, holes are injected from the p-region and electrons are injected from the n-region. Then, the electrons and the holes are re-combined at the active layer constituted by the NF-doped silicon ultra-thin films, thereby making it possible to generate the emission through the current injection. This emission is amplified at the optical resonator 2 and when it exceeds the threshold current, laser oscillation is caused to generate.

In the case of the semiconductor laser according to this example, it was possible to obtain, through the injection of a current, a current injection emission of light having a peak at 1.2 μm or so (up to 1 eV) and also to obtain a laser oscillation having a sharp peak at 0.96 eV as a current exceeding 25 mA was injected thereinto. The performance characteristics of this laser at room temperature (25° C.) were: 18 mW in output, and 18.8% in external quantum efficiency (100 mA during 4-V operation). By creating an elemental structure for enhancing the $\Gamma$ by following the principle of the present invention, it is possible, by making use of silicon, to obtain a semiconductor laser having practical characteristics.

Example 3

Light-Emitting Diode

Figure 7:
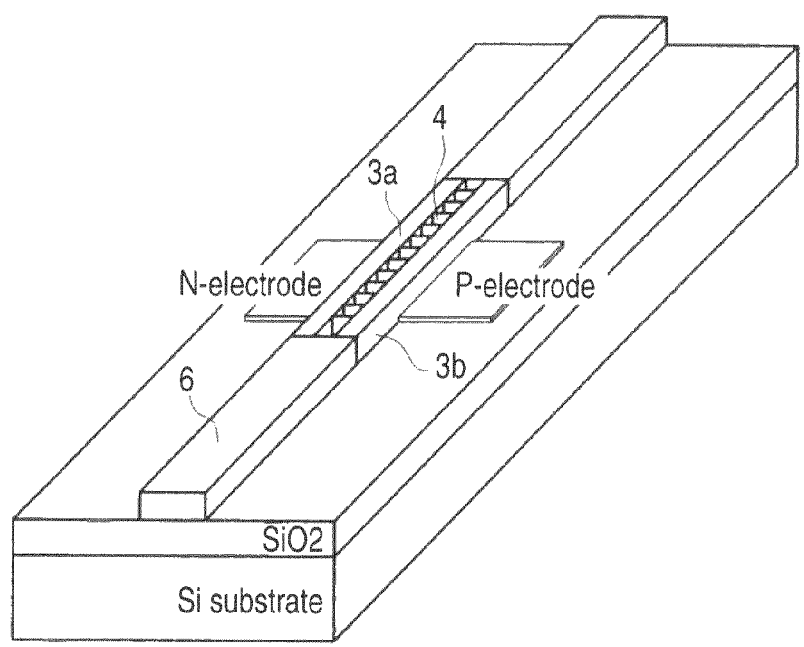
FIG. 7 is a perspective view of a silicon light-emitting diode according to a third embodiment of the present invention.

This example illustrates a specific example of the light-emitting diode shown in FIG. 7. The light-emitting diode according to this example differs from the semiconductor laser of Example 1 in two aspects, i.e., the optical resonator is omitted; and accordingly, there is provided no dielectric multilayer mirror. Other features of the device excluding above-mentioned two points are the same as those of the semiconductor laser of Example 1.

When this light-emitting diode constructed as described above is actuated by flowing a current, holes are injected from the p-region and electrons are injected from the n-region. Then, the electrons and the holes are re-combined in the region of active layer 4 constituted by the NF-doped silicon ultra-thin films, thereby making it possible to generate the electroluminescence through the current injection.

In the case of the device according to this example, it was possible to obtain, through the injection of a current, a current injection emission of light having a peak at 1.2 μm or so (up to 1 eV) and exhibiting a strong directivity. The performance characteristics of this diode at room temperature (25° C.) were: 15 mW in output, and 12.5% in external quantum efficiency (120 mA during 4.5-V operation). By creating an elemental structure for enhancing the $\Gamma$ by following the principle of the present invention, it is possible, by making use of silicon, to obtain a light-emitting diode exhibiting a strong directivity and having practical characteristics.

In the foregoing examples, silicon was employed as a material for the wires and the ultra-thin films. However, it is possible in the present invention to employ, other than silicon, a Group IV semiconductor or a Group IV compound semiconductor such as silicon/germanium, germanium, silicon carbide, carbon/silicon/germanium, etc.

Further, with respect to the impurity which is capable of giving strong light-emitting properties to the active layer formed of ultra-thin films, it is possible, in addition to an N—F pair, an N—In pair, S, C, or rare earth ions excluding La and Lu. Any kinds of impurities other than those mentioned above may be also employed, provided that they are capable of giving strong light-emitting properties.

Although the foregoing explanation is made based on the impurity-doped silicon ultra-thin films, it is also possible to achieve the laser oscillation by making use of non-doped silicon ultra-thin films even though the "g" thereof may be small and the threshold value thereof may be high. In the foregoing embodiment, although the ultra-thin films are longitudinally disposed on the SOI substrate, these films may be laterally disposed on the SOI substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor light-emitting device comprising:
   an insulating film;
   an optical resonator formed on the insulating film and including
      a first semiconductor wire and a second semiconductor wire which are arranged in parallel with a space left therebetween, said space being narrower than emission wavelength,
      resonator mirrors disposed at both ends of these semiconductor wires, and
      a plurality of semiconductor ultra-thin films which are interposed between the first semiconductor wire and the second semiconductor wire and are electrically connected with these semiconductor wires; and
   a p-electrode and an n-electrode which are disposed on both sides of the optical resonator, respectively,
   wherein the first semiconductor wire is electrically connected with the p-electrode, and the second semiconductor wire is electrically connected with the n-electrode, thereby enabling the semiconductor ultra-thin films to generate laser oscillation as a current is injected thereinto.

2. The device according to claim 1, wherein each of the resonator mirrors is a multi-layer mirror including a Group IVb elemental semiconductor or a Group IVb compound semiconductor having a first refractive index, and an insulator having a second refractive index lower than the first refractive index.

3. The device according to claim 1, which further comprises a waveguide optically connected with the resonator mirror of the optical resonator, enabling a laser oscillation beam to be derived from the waveguide.

4. The device according to claim 1, wherein the resonator mirrors are spaced apart from each other by a distance ranging from 10 nm to 10 μm, and the first semiconductor wire and the second semiconductor wire are spaced apart from each other by a distance ranging from 10 to 200 nm.

5. The device according to claim 1, wherein each of the semiconductor ultra-thin films is formed of a Group IVb elemental semiconductor or a IVb-IVb compound semiconductor both containing N and F, or N and In, or N and Cl, or S, or C, or a rare earth ion excluding La and Lu, and having a tetrahedral bond structure.

6. The device according to claim 1, wherein each of the semiconductor ultra-thin films is formed of a Group IVb elemental semiconductor or a IVb-IVb compound semiconductor both containing no impurity and having a tetrahedral bond structure.

7. The device according to claim 1, wherein each of the semiconductor ultra-thin films has a thickness of not more than 10 nm.

8. The device according to claim 1, wherein the semiconductor ultra-thin films are spaced apart from one another by a distance which is smaller than the emission wavelength.

9. A semiconductor light-emitting device comprising:
an insulating film;
a ring-shaped optical resonator formed on the insulating film, and including a first ring-shaped semiconductor wire and a second ring-shaped semiconductor wire which are arranged side by side with a space left therebetween, narrower than emission wavelength, and a plurality of semiconductor ultra-thin films interposed between the first semiconductor wire and the second semiconductor wire and electrically connected with these semiconductor wires; and
a p-electrode and an n-electrode which are disposed on the both sides of the optical resonator, respectively,
wherein the first semiconductor wire is electrically connected with the p-electrode, and the second semiconductor wire is electrically connected with the n-electrode, thereby enabling the semiconductor ultra-thin films to generate laser oscillation as a current is injected thereinto.

10. The device according to claim 9, which further comprises a waveguide arranged near the optical resonator and optically connected with the optical resonator, enabling a laser oscillation beam to be derived from the waveguide.

11. The device according to claim 9, wherein each of the semiconductor ultra-thin films is formed of a Group IVb elemental semiconductor or a IVb-IVb compound semiconductor both containing N and F, or N and In, or N and Cl, or S, or C, or a rare earth ion excluding La and Lu, and having a tetrahedral bond structure.

12. The device according to claim 9, wherein each of the semiconductor ultra-thin films is formed of a Group IVb elemental semiconductor or a IVb-IVb compound semiconductor both containing no impurity and having a tetrahedral bond structure.

13. The device according to claim 9, wherein each of the semiconductor ultra-thin films has a thickness of not more than 10 nm.

14. The device according to claim 9, wherein the semiconductor ultra-thin films are spaced apart from one another by a distance which is smaller than the emission wavelength.

15. A semiconductor light-emitting device comprising:
an insulating film;
a first semiconductor wire and a second semiconductor wire which are formed on the insulating film and arranged in parallel with a space left therebetween, narrower than emission wavelength;
a plurality of semiconductor ultra-thin films are arranged between the first semiconductor wire and the second semiconductor wire and electrically connected with these semiconductor wires; and
a p-electrode and an n-electrode which are formed on the insulating film and disposed on the both sides of the first and the second semiconductor wires, respectively,
wherein the first semiconductor wire is electrically connected with the p-electrode, and the second semiconductor wire is electrically connected with the n-electrode, thereby enabling the semiconductor ultra-thin films to generate electroluminescence as a current is injected thereinto.

16. The device according to claim 15, wherein each of the semiconductor ultra-thin films is formed of a Group IVb elemental semiconductor or a IVb-IVb compound semiconductor both containing N and F, or N and In, or S, or C, or a rare earth ion excluding La and Lu, and having a tetrahedral bond structure.

17. The device according to claim 15, wherein each of the semiconductor ultra-thin films is formed of a Group IVb elemental semiconductor or a IVb-IVb compound semiconductor both containing no impurity and having a tetrahedral bond structure.

18. The semiconductor light-emitting device according to claim 15, wherein each of the semiconductor ultra-thin films has a thickness of not more than 10 nm.

19. The device according to claim 15, wherein the semiconductor ultra-thin films are spaced apart from one another by a distance which is smaller than the emission wavelength.

* * * * *